(12) United States Patent
Jiang

(10) Patent No.: US 6,359,334 B1
(45) Date of Patent: Mar. 19, 2002

(54) THERMALLY CONDUCTIVE ADHESIVE TAPE FOR SEMICONDUCTOR DEVICES AND METHOD USING THE SAME

(75) Inventor: Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/327,692

(22) Filed: Jun. 8, 1999

(51) Int. Cl.[7] .......................... H01L 23/10; H01L 23/34
(52) U.S. Cl. ....................... 257/706; 257/700; 257/783; 257/678
(58) Field of Search ................................ 257/706, 700, 257/783, 678; 438/122, 125, 118

(56) References Cited

U.S. PATENT DOCUMENTS

| | | | |
|---|---|---|---|
| 5,122,858 A | * 6/1992 | Mahulikar et al. | 257/783 |
| 5,277,972 A | 1/1994 | Sakumoto et al. | 428/355 |
| 5,304,842 A | * 4/1994 | Farnworth et al. | 257/668 |
| 5,773,113 A | 6/1998 | Akhter | 428/41.8 |
| 5,824,182 A | 10/1998 | Sakumoto et al. | 156/300 |
| 5,840,598 A | * 11/1998 | Grigg et al. | 438/118 |
| 5,852,326 A | 12/1998 | Khandros et al. | 257/692 |
| 5,866,949 A | 2/1999 | Schueller | 257/778 |
| 5,874,784 A | 2/1999 | Aoki et al. | 257/787 |
| 5,891,566 A | 4/1999 | Sakumoto et al. | 428/343 |
| 5,943,557 A | * 8/1999 | Moden | 438/118 |
| 6,107,679 A | * 8/2000 | Noguchi | 257/678 |
| 6,169,328 B1 | 2/2001 | Mitchell et al. | 257/778 |

FOREIGN PATENT DOCUMENTS

| | | | |
|---|---|---|---|
| JP | 1-244652 | * 9/1989 | 257/706 |
| JP | 2-105443 | * 4/1990 | |
| JP | 4-199723 | * 7/1992 | |

OTHER PUBLICATIONS

"ALT Leadframe Adhesive Tapes, Technical Information and Comparative Data," *Brady*, http://www.unit.ru/marking/alt.htm, pp. (Feb. 23, 1999).

"Electronic Packaging and Interconnection Handbook", pp. 2.2–2.7, C. Harper.*

* cited by examiner

*Primary Examiner*—Jhihan B Clark
(74) *Attorney, Agent, or Firm*—Dorsey & Whitney LLP

(57) ABSTRACT

A thermally conductive adhesive tape and method for its use in packaging integrated circuits fabricated on semiconductor material. The thermally conductive adhesive tape includes a thermally conductive base upon which an adhesive layer is laminated or coated onto at least one side of the thermally conductive base. Thermal energy generated by operating the integrated circuit may be transferred from the integrated circuit via the thermally conductive adhesive tape to a medium to which the semiconductor material is attached. As a result, any excessive heat that may negatively affect the performance of the integrated circuit is dissipated through the medium.

41 Claims, 3 Drawing Sheets

THERMALLY CONDUCTIVE ADHESIVE TAPE FOR SEMICONDUCTOR DEVICES AND METHOD USING THE SAME

TECHNICAL FIELD

The present invention relates to semiconductor device packaging, and more particularly, to attaching a semiconductor die in a device package.

BACKGROUND OF THE INVENTION

Semiconductor devices are typically fabricated on thin wafers of silicon. Several die are produced on each wafer, with each die representing a single semiconductor device. Each die on a wafer is tested for gross functionality, and sorted according to whether the die passes or fails the gross functionality test. After being sorted according to gross functionality, the wafers are cut using a wafer saw, and the individual die are singulated. The die determined to be non-functional are scrapped. The functional die are packaged and further tested to ensure that each packaged device satisfies a minimum level of performance. Typically, the functional devices are permanently packaged by encapsulating the die in a plastic package. Packaging of the functional devices facilitates handling of the devices and also protects the die from damage during the manufacture of circuits using the packaged devices.

There are several conventional structures and methods for packaging singulated die. For example, more common package types include small outline j-bend (SOJ) packages, thin small outline packages (TSOP), and zigzag in-line packages (ZIP). The finished packaged devices are often mounted onto a substrate to form a module. A singulated die is packaged in the aforementioned package types by attaching the die to a lead frame paddle and electrically coupling exposed bond pads of the die to metal leads. The lead frame, die, and a portion of the metal leads are subsequently encapsulated by a plastic resin to protect the integrated circuit from damage. The encapsulated device is then trimmed from the lead frame and the metal leads formed to the correct shape.

An alternative lead frame structure, known as lead on chip (LOC) may be employed instead of the structure having a lead frame paddle. In an LOC structure, individual metal leads are typically attached to the surface of the die using double-sided adhesive tape having a polyimide base coated on both sides with adhesive material. The metal leads and die are then heated to melt the adhesive material. The bond pads of the semiconductor die are subsequently wire bonded to a respective metal lead to electrically connect the semiconductor die to receive electrical signals applied to the conductive leads. The LOC lead frame and die are then encapsulated in a plastic resin, then followed by a trim and form process. The LOC structure and packaging process are described in U.S. Pat. No. 4,862,245 to Pashby et al., issued Aug. 29, 1989, and U.S. Pat. No. 4,916,519 to Ward, issued Apr. 10, 1990, which are incorporated herein by reference.

Recently, semiconductor manufacturers have developed a package structure where unpackaged die are mounted directly onto a substrate, for example, a printed circuit board, thus allowing modules to be designed with increased device density. The devices are mounted onto the substrate and are electrically coupled by wire bonding the bond pads of the die to conductive traces formed on the surface of the substrate. The die are typically attached to the substrate by using strips of single or double-sided adhesive tape that are sandwiched between the substrate and the die. Following attachment, the substrate and die are heated to cure the adhesive in order to firmly fix the die.

As described above, many of the current methods of packaging semiconductor die involve attaching the die to a lead frame or a substrate using a single or double-sided adhesive tape. However, a problem with the conventional die attachment structures is that they do not facilitate the transmission or dissipation of heat generated by the device while in operation. The heat generated by an integrated circuit fabricated on the semiconductor die may adversely affect the performance of the device if not dissipated. The problems associated with the heat generated by the individual devices have been precipitated by the demand for high speed memory systems.

Consequently, the individual devices generate more heat than when operated at slower speeds. For example, in a RAMBUS memory architecture, or other high-speed memory application, the heat generated by the individual packaged devices may operate at temperatures as high as 100° C. In the case where the generated heat is not dissipated, the temperature may be great enough to cause memory system errors. Therefore, there is a need for a means to dissipate excessive heat generated by an integrated circuit in a packaged semiconductor device when being operated.

SUMMARY OF THE INVENTION

The present invention is directed to a thermally conductive adhesive tape and method for its use in packaging integrated circuits fabricated on semiconductor material. The thermally conductive adhesive tape includes a thermally conductive base upon which an adhesive layer is laminated or coated onto at least one side of the thermally conductive base. Thermal energy may be dissipated by transferring the heat through the thermally conductive adhesive tape from the integrated circuit to the medium to which the integrated circuit is attached.

DETAILED DESCRIPTION OF THE INVENTION

A thermally conductive adhesive tape may be used to attach a semiconductor die in those package types requiring adhesive tapes. The heat generated by an integrated circuit fabricated on the semiconductor die during its operation will be transferred through the thermally conductive adhesive tape to a medium to which the semiconductor die is attached. Thus, the medium may act as a heat sink for the semiconductor die and dissipate any excessive heat generated by the integrated circuit.

Figure 1:
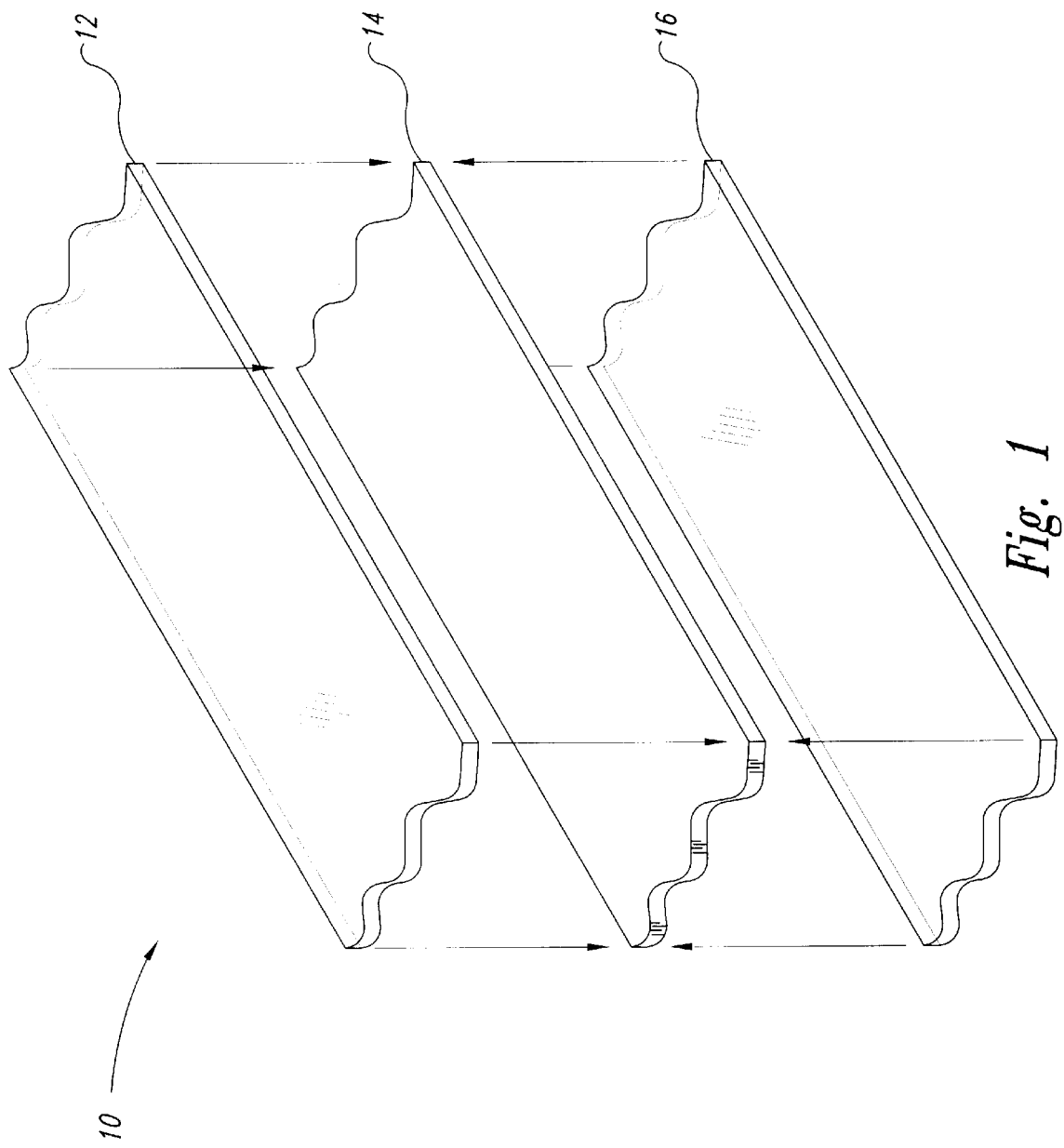
FIG. 1 is an exploded isometric view of an thermally conductive adhesive tape according to an embodiment of the present invention.

Shown in FIG. 1 is a thermally conductive adhesive tape 10 according to an embodiment of the present invention. An adhesive layer 12 is laminated or coated to one side of a thermally conductive carrier layer 14. Such adhesives for use in semiconductor device packaging are well known in the art and will not be discussed in detail herein in the interests of brevity. Some examples of well known adhesives are epoxy, NBR-phenol resin, and polyimide, to name a few. Another adhesive layer 16 is laminated or coated to the opposite side of the thermally conductive carrier 14. However, the thermally conductive adhesive tape 10 may have an adhesive laminated or coated to only one side of the thermally conductive carrier 14, and still remain within the scope of the present invention. The side without adhesive material would be attached to an object in a conventional manner, for example, using epoxy or other adhesive. Such methods of attachment are well known in the art and will not be discussed in detail herein for the sake of brevity. Whether the thermally conductive adhesive tape 10 is single-sided or double-sided depends on the particular application of the thermally conductive adhesive tape 10.

As a person of ordinary skill in the art will appreciate, the material from which the thermally conductive carrier is formed will be also determined from the particular application of the thermally conductive adhesive tape 10. Some typical examples of materials are platinum, aluminum, gold, copper, and silver. An advantage to using a copper foil as the thermally conductive carrier 14 is that copper foil is commercially available in the market in 5, 9, 12, and 18 $\mu$m thicknesses. Additionally, slitting technology for copper foil is already known, and working copper foil material, for example punching the copper foil, does not appear to be problematic.

The material from which the thermally conductive carrier 14 is formed also includes non-metallic materials that have sufficient thermal conductivity. For reasons of comparison, the thermal conductivity of platinum, aluminum, gold, copper, and silver at 400° K. are, 0.722, 2.40, 3.12, 3.92, and 4.20 Watts per centimeter-degree Kelvin (W/cm° K.), respectively. Non-metallic materials may have thermal conductivities greater or lower these values, but should have higher values of thermal conductivity than the conventional thermally resistant base, for example, a polyimide base, which has a thermal conductivity of approximately 0.002 W/cm° K.

Figure 2:
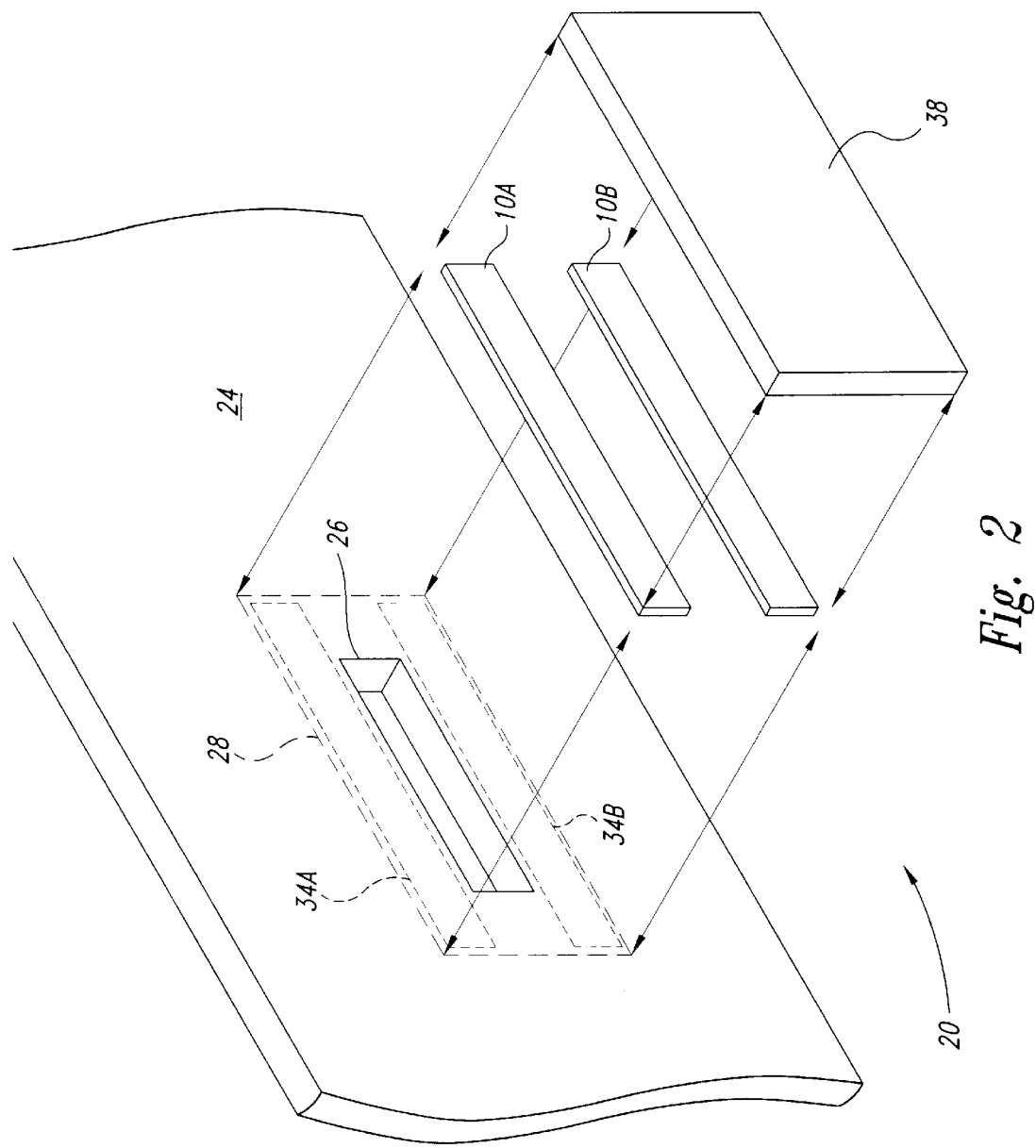
FIG. 2 is an exploded isometric view of a Board On Chip (BOC) type package using the thermally conductive adhesive tape of FIG. 1.

FIG. 2 illustrates an example of an application of the adhesive material in a Board On Chip ("BOC") type package 20. A semiconductor die 38 is attached to a substrate 24 in a position represented by outline 28. The substrate 24 may be a rigid organic substrate, such as BT resin, or FR-4 or FR-5 material, or a flexible substrate, such as polyimide. A person of ordinary skill in the art will appreciate that the substrate 24 may formed from materials other than those provided herein. Consequently, the type of material used for the substrate 24 does not limit the scope of the present invention. The substrate 24 has an opening 26 through the substrate which exposes a portion of the semiconductor die 38 when positioned according to the outline 28. Strips of thermally conductive adhesive tape 10a and 10b are adhered to the surface of the substrate 24 adjacent to the opening 26, as indicated by outlines 34a and 34b, respectively. The thermally conductive adhesive tape illustrated in FIG. 2 has adhesive material laminated or coated to both sides of the thermally conductive carrier. A singulated semiconductor integrated circuit, or die 38, is positioned with respect to the substrate 24 as shown in FIG. 2, and attached to the substrate 24 by pressing the die 38 against the strips of thermally conductive adhesive tape 10a and 10b. The entire BOC package 20 is subsequently heated to melt the adhesive layers of the tape 10a and 10b.

The surface of the die 38 contacting the strips of thermally conductive adhesive tape 10a and 10b typically has a protective layer of polyimide or SiON to prevent the device from being damaged during the die singulating process or the die attachment process. Consequently, the die 38 will not be damaged when attached to the substrate 24. The die 38 has bond pads (not shown) formed essentially along its longitudinal axis that are exposed through the protective layer of polyimide or SiON. When the die 38 is mounted onto the substrate 24 in the position shown by the outline 28 the bond pads will remain exposed through the opening 26. The die 38 is electrically connected to electrically conductive traces (not shown) formed on the surface of the substrate 24, opposite of the one to which the die 38 is attached, by bond wires bonded to the bond pads of the die 38. That is, the bond wires extend from the bond pads of the die 38, through the opening 26, and to the electrically conductive traces formed on the surface of the substrate 24. The resulting structure is then substantially encapsulated to protect it from damage. Types of encapsulant materials are well known in the art, it will not be described in detail herein for the sale of brevity.

The BOC type structure illustrated in FIG. 2 is constructed in a manner such that the heat generated by the semiconductor die 38 during its operation is transmitted to the substrate 24 through the thermally conductive carrier of the thermally conductive adhesive tape 10a and 10b. Thus, the substrate 24 acts as a heat sink to draw heat away from the die 38 and dissipate the generated heat. In contrast, the conventional adhesive tape constructed from a heat resistant base cannot efficiently transmit the heat generated by the die 38 to the substrate 24. Consequently, and as mentioned previously, the performance of the integrated circuit fabricated on the semiconductor die 38 may be adversely affected by the excessive heat when the device is used in high-speed memory applications.

Figure 3:
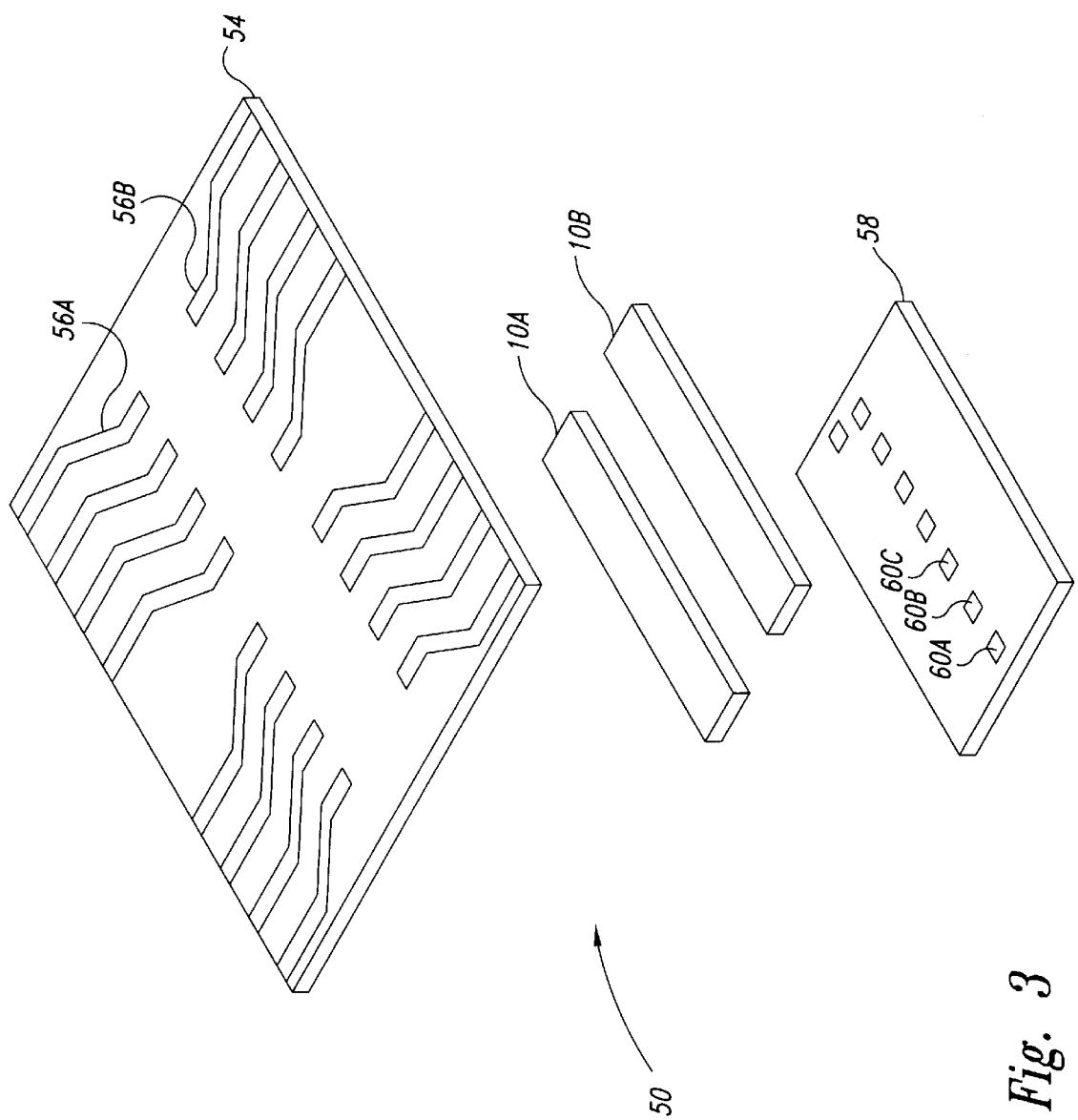
FIG. 3 is an exploded isometric view of a Lead On Chip (LOC) type package using the thermally conductive adhesive tape of FIG. 1.

Shown in FIG. 3 is another example where the thermally Conductive adhesive tape 10 (FIG. 1) may be used for packaging integrated circuits. A packaged semiconductor device is formed using a Lead On Chip ("LOC") type structure 50. A lead frame 54 is formed having lead fingers 56a and 56b to which a die 58 is attached and electrically bonded through bond wires. Strips of thermally conductive adhesive tape 10a and 10b are adhered to the surface of the lead fingers 56a and 56b, respectively. Typically, the lead frame 54 comes formed in strips having several lead frames, and having the strips of thermally conductive adhesive tape 10a and 10b pre-attached to the lead fingers 56a and 56b in order to facilitate the die attach process. However, additional lead frames have been omitted from FIG. 3 to simplify the explanation of the LOC type structure 50.

The die 58 is formed with bond pads 60a–c located substantially along the longitudinal axis of the die 58. The die 58 is attached to the lead frame 54 by pressing the die 58 against the lead frame 54 and the strips of thermally conductive adhesive tape 10a and 10b. The lead frame 54, the strips of thermally conductive adhesive tape 10a and 10b, and the die 58 are heated to cure the adhesive and firmly attach the die 58 to the lead frame 54. The die 58 is subsequently electrically coupled to the respective lead fingers 56a and 56b through bond wires (not shown) bonded to the bond pads 60a–c and the respective lead fingers 56a and 56b. The LOC structure 50 will eventually be encapsulated in a plastic package to protect the die 58 from damage and to facilitate handling.

From the foregoing it will be appreciated that, although specific embodiments of the invention have been described herein for purposes of illustration, various modifications may be made without deviating from the spirit and scope of the invention. For example, the thermally conductive adhesive tape 10 has been shown with regards to the specific applications of a BOC and a LOC type package. However, the use of the thermally conductive adhesive tape 10 is not limited to only these applications, but includes any package type where an adhesive tape is required for die attachment. Accordingly, the invention is not limited except as by the appended claims.

What is claimed is:

1. An adhesive tape for use in packaged semiconductor devices, comprising:
   a flexible heat conductive base layer having two surfaces and further having a thermal conductivity of at least approximately 1 W/cm° K; and
   an adhesive layer laminated to at least one of the two surfaces of the flexible heat conductive base layer.

2. The adhesive tape of claim 1 wherein the flexible thermally conductive base layer comprises copper foil.

3. The adhesive tape of claim 1 wherein the flexible thermally conductive base layer is formed from a material selected from the group consisting of platinum, aluminum, gold, copper and silver.

4. The adhesive tape of claim 1 wherein the flexible thermally conductive base layer is formed from a material selected from the group consisting of platinum, aluminum, gold, copper and silver, and has a thickness of less than approximately 20 microns.

5. The adhesive tape of claim 1 wherein the flexible thermally conductive base layer is formed from a material selected from the group consisting of platinum, aluminum, gold, copper and silver, and has a thickness of at least approximately 5 microns.

6. An adhesive tape for use in packaged semiconductor devices, comprising:
   a flexible heat conductive base layer having two surfaces and further having a thermal conductivity of at least approximately 0.5 W/m° K.; and
   an adhesive layer laminated to one of the two surfaces of the flexible heat conductive base layer.

7. The adhesive tape of claim 6 wherein the flexible heat conductive base layer is formed from a material selected from the group consisting of platinum, aluminum, gold, copper and silver.

8. An adhesive tape for use in packed semiconductor devices, comprising:
   a flexible heat conductive base layer having two surfaces and further having a thermal conductivity of at least 3 W/cm° K.; and
   an adhesive layer laminated to at least one of the two surfaces of the flexible heat conductive base layer.

9. An adhesive tape for attaching semiconductor die, comprising:
   a flexible heat conductive base layer having two surfaces and further having a thermal conductivity of at least approximately 1 W/cm° K.; and
   an adhesive layer laminated to both surfaces of the flexible heat conductive base layer.

10. The adhesive tape of claim 9 wherein the flexible heat conductive base layer is formed from a material selected from the group consisting of platinum, aluminum, gold, copper and silver.

11. The adhesive tape of claim 9 wherein the flexible heat conductive base layer comprises copper.

12. An adhesive tape for attaching semiconductor die, comprising:
   a flexible heat conductive base layer having two surfaces and further having a thermal conductivity of at least approximately 3 W/cm° K; and
   an adhesive layer laminated to both surfaces of the flexible heat conductive base layer.

13. A packaged semiconductor device, comprising:
   a semiconductor die having an integrated circuit;
   a thermally conductive adhesive tape adhered to a surface of the semiconductor die, the thermally conductive adhesive tape comprising:
      a flexible thermally conductive carrier base formed from a material selected from the group consisting of platinum, aluminum, gold, copper and silver; and
      an adhesive layer laminated to a first surface of the flexible thermally conductive carrier base; and
   a substrate having at least one conductive trace electrically coupled to the semiconductor die and being formed on a first surface of the substrate, the substrate further having a second surface to which the semiconductor die is attached, the semiconductor die thermally coupled to the substrate through the thermally conductive adhesive tape to transfer thermal energy to the substrate.

14. The packaged semiconductor device of claim 13 wherein the semiconductor die is electrically coupled to the at least one conductive trace through a bond wire.

15. The packaged semiconductor device of claim 13 wherein the thermally conductive adhesive tape further comprises a second adhesive layer laminated to a second surface of the flexible thermally conductive carrier base.

16. The packaged semiconductor device of claim 13 wherein the flexible thermally conductive carrier base comprises a foil material.

17. The packaged semiconductor device of claim 13 wherein the flexible thermally conductive carrier base has a thickness of less than approximately 20 microns.

18. The packaged semiconductor device of claim 13 wherein the flexible thermally conductive carrier base has a thickness of at least approximately 5 microns.

19. The packaged semiconductor device of claim 14, further comprising an encapsulant substantially covering the semiconductor die and the bond wire for protection.

20. A packaged semiconductor device, comprising:
   a semiconductor die having an integrated circuit;
   a thermally conductive adhesive tape adhered to a surface of the semiconductor die, the thermally conductive adhesive tape comprising:
      a flexible thermally conductive carrier base having a thermal conductivity of at least approximately 1 W/cm° K; and
      an adhesive layer laminated to a first surface of the flexible thermally conductive carrier base; and
   a substrate having at least one conductive trace electrically coupled to the semiconductor die and being formed on a first surface of the substrate, the semiconductor die thermally coupled to the substrate through the thermally conductive adhesive tape to transfer thermal energy to the substrate.

21. A packaged semiconductor device, comprising:
   a semiconductor die having an integrated circuit;
   a thermally conductive adhesive tape adhered to a surface of the semiconductor die, the thermally conductive adhesive tape comprising:
      a flexible thermally conductive carrier base having a thermal conductivity of at least approximately 3 W/cm° K.; and an adhesive layer laminated to a first surface of the flexible thermally conductive carrier base; and a substrate having at least one conductive trace electrically coupled to the semiconductor die and being formed on a first surface of the substrate, the semiconductor die thermally coupled to the substrate through the thermally conductive adhesive tape to transfer thermal energy to the substrate.

22. A packaged semiconductor device, comprising:

a semiconductor die having an integrated circuit;

a lead frame adhered to the semiconductor die and having leads electrically coupled to the integrated circuit;

a thermally conductive adhesive tape disposed between the semiconductor die and the lead frame for adhering the two together, the thermally conductive adhesive tape comprising:

a flexible heat conductive base layer having two surfaces and further having a thermal conductivity of at least approximately 1 W/cm° K.; and an adhesive layer laminated to one of the two surfaces of the flexible heat conductive base layer; and a device package substantially surrounding the semiconductor die and the lead frame, the device package protecting the semiconductor device from handling damage.

23. The packaged semiconductor device of claim 22 wherein the thermally conductive adhesive tape further comprises a second adhesive layer laminated to the other of the two surfaces of the flexible heat conductive base layer.

24. The packaged semiconductor device of claim 22 wherein the flexible heat conductive base layer comprises copper foil.

25. The packaged semiconductor device of claim 22 wherein the flexible heat conductive base layer is formed from a material selected from the group consisting of platinum, aluminum, gold, copper and silver.

26. The packaged semiconductor device of claim 22 wherein the flexible heat conductive base layer is formed from a material selected from the group consisting of platinum, aluminum, gold, copper and silver, and has a thickness of less than approximately 20 microns.

27. The packaged semiconductor device of claim 22 wherein the flexible heat conductive base layer is formed from a material selected from the group consisting of platinum, aluminum, gold, copper and silver, and has a thickness of at least approximately 5 microns.

28. A packaged semiconductor device, comprising:

a semiconductor die having an integrated circuit;

a lead frame adhered to the semiconductor die and having leads electrically coupled to the integrated circuit;

a thermally conductive adhesive tape disposed between the semiconductor die and the lead frame for adhering the two together, the thermally conductive adhesive tape comprising:

a flexible heat conductive base layer having two surfaces and further having a thermal conductivity of at least approximately 3 W/cm° K.; and an adhesive layer laminated to one of the two surfaces of the flexible heat conductive base layer; and a device package substantially surrounding the semiconductor die and the lead frame, the device package protecting the semiconductor device from handling damage.

29. A packaged semiconductor device, comprising:

a semiconductor die having an integrated circuit;

a thermally conductive adhesive tape adhered to a surface of the semiconductor die, the thermally conductive adhesive tape comprising:

a thermally conductive carrier base formed from a copper foil material;

a first adhesive layer laminated to a first surface of the thermally conductive carrier base; and a second adhesive layer laminated to a second surface of the thermally conductive carrier base; and a substrate having at least one conductive trace electrically coupled to the semiconductor die and being formed on a first surface of the substrate, the semiconductor die thermally coupled to the substrate through the thermally conductive adhesive tape to transfer thermal energy to the substrate.

30. The packaged semiconductor device of claim 29 wherein the semiconductor die is attached to a second surface of the substrate.

31. The packaged semiconductor device of claim 29 wherein the semiconductor die is electrically coupled to the at least one conductive trace through a bond wire.

32. The packaged semiconductor device of claim 29 wherein the thermally conductive carrier base is formed from a material selected from the group consisting of platinum, aluminum, gold, copper and silver, and has a thickness of less than approximately 20 microns.

33. The packaged semiconductor device of claim 29 wherein the thermally conductive carrier base is formed from a material selected from the group consisting of platinum, aluminum, gold, copper and silver, and has a thickness of at least approximately 5 microns.

34. The packaged semiconductor device of claim 29 wherein the thermally conductive carrier base comprises a material having a thermal conductivity of at least approximately 1 W/cm° K.

35. The packaged semiconductor device of claim 29 wherein the thermally conductive carrier base comprises a material having a thermal conductivity of at least approximately 3 W/cm° K.

36. The packaged semiconductor device of claim 31, further comprising an encapsulant substantially covering the semiconductor die and the bond wire for protection.

37. An adhesive tape for electronic parts, comprising:

a thermally conductive base layer having two surfaces and formed from a material selected from the group consisting of platinum, aluminum, gold, copper and silver; and an adhesive layer laminated to both surfaces of the thermally conductive base layer.

38. The adhesive tape of claim 37 wherein the thermally conductive base layer comprises copper foil.

39. The adhesive tape of claim 37 wherein the thermally conductive base layer is formed from a material selected from the group consisting of platinum, aluminum, gold, copper and silver.

40. The adhesive tape of claim 37 wherein the thermally conductive base layer has a thickness of less than approximately 20 microns.

41. The adhesive tape of claim 37 wherein the thermally conductive base layer has a thickness of at least approximately 5 microns.

* * * * *

UNITED STATES PATENT AND TRADEMARK OFFICE
CERTIFICATE OF CORRECTION

PATENT NO.     : 6,359,334 B1
DATED          : March 19, 2002
INVENTOR(S)    : Tongbi Jiang It is certified that error appears in the above-identified patent and that said Letters Patent is hereby corrected as shown below:

<u>Title page, Item [54] and Column 1, line 3,</u>
In the Title, reads "METHOD USING THE SAME" should read -- METHOD FOR USING THE SAME --
Item [56], OTHER PUBLICATIONS, 1st reference, reads "pp. (Feb. 23, 1999)." should read -- pp. 1-7 (Feb 23, 1999). --

<u>Column 2,</u>
Line 62, reads "beat" should read -- heat --

<u>Column 3,</u>
Line 33, reads "400° K." should read -- 400 °K --
Line 34, reads "(W/cm° K.)," should read -- (W/cm °K), --
Line 40, reads "W/cm° K." should read -- W/cm °K. --
Line 48, reads "may formed" should read -- may be formed --

<u>Column 4,</u>
Line 40, reads "sale" should read -- sake --

<u>Column 5,</u>
Line 14, reads "W/cm° K;" should read -- W/cm °K; --
Lines 48 and 55, reads "W/cm° K.;" should read -- W/cm °K; --
Line 68, reads "W/cm° K.;" should read -- W/cm °K; --

<u>Column 6,</u>
Line 47, reads "W/cm° K;" should read -- W/cm °K; --
Line 63, reads "W/cm° K;" should read -- W/cm °K; --

<u>Column 7,</u>
Line 19, reads "W/cm° K.;" should read -- W/cm °K; --
Line 57, reads "W/cm° K.;" should read -- W/cm °K; --

UNITED STATES PATENT AND TRADEMARK OFFICE
CERTIFICATE OF CORRECTION

PATENT NO. : 6,359,334 B1
DATED : March 19, 2002
INVENTOR(S) : Tongbi Jiang

It is certified that error appears in the above-identified patent and that said Letters Patent is hereby corrected as shown below:

<u>Column 8,</u>
Lines 37 and 41, reads "W/cm° K." should read -- W/cm °K. --

Signed and Sealed this

Fifth Day of August, 2003

JAMES E. ROGAN
*Director of the United States Patent and Trademark Office*